(12) United States Patent
Nishimura et al.

(10) Patent No.: US 10,879,137 B2
(45) Date of Patent: Dec. 29, 2020

(54) TEMPLATE, TEMPLATE COMPONENT, AND SEMICONDUCTOR DEVICE MANUFACTURING METHOD

(71) Applicant: Toshiba Memory Corporation, Minato-ku (JP)

(72) Inventors: Takahito Nishimura, Kuwana (JP); Suigen Kanda, Nagoya (JP); Takamasa Usui, Koto (JP); Masayoshi Tagami, Kuwana (JP); Jun Iljima, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 97 days.

(21) Appl. No.: 15/901,115

(22) Filed: Feb. 21, 2018

(65) Prior Publication Data

US 2019/0074230 A1 Mar. 7, 2019

(30) Foreign Application Priority Data

Sep. 5, 2017 (JP) .................................. 2017-170372

(51) Int. Cl.
*G03F 7/00* (2006.01)
*H01L 21/66* (2006.01)
*H01L 21/027* (2006.01)
*G03F 7/16* (2006.01)
*B29C 59/02* (2006.01)
*B29L 31/34* (2006.01)

(52) U.S. Cl.
CPC ............ *H01L 22/24* (2013.01); *B29C 59/026* (2013.01); *G03F 7/0002* (2013.01); *G03F 7/168* (2013.01); *H01L 21/0271* (2013.01); *B29L 2031/34* (2013.01); *H01L 22/12* (2013.01)

(58) Field of Classification Search
CPC ... G03F 7/0002; G03F 7/0017; B23K 20/026; B29C 59/002
See application file for complete search history.

(56) References Cited

U.S. PATENT DOCUMENTS

| | | | |
|---|---|---|---|
| 2003/0027967 A1* | 2/2003 | Hori ........................ | B29C 39/10 528/10 |
| 2012/0009791 A1 | 1/2012 | Zhang et al. | |
| 2013/0078332 A1 | 3/2013 | Satou et al. | |

FOREIGN PATENT DOCUMENTS

| | | |
|---|---|---|
| JP | 2013-73999 | 4/2013 |
| JP | 5395757 | 1/2014 |
| JP | 2014-179630 | 9/2014 |
| JP | 2015-63065 | 4/2015 |

* cited by examiner

*Primary Examiner* — Mounir S Amer
*Assistant Examiner* — Alexander Belousov
(74) *Attorney, Agent, or Firm* — Oblon, McClelland, Maier & Neustadt, L.L.P.

(57) ABSTRACT

According to an embodiment, a template includes a flat plate-shaped first member, a flat plate-shaped second member including a pattern arrangement face, and a flat plate-shaped third member provided with an opening at a position corresponding to an arrangement position of the second member. The template is dividable at a position of at least one of a first boundary between the first member and the second member and a second boundary between the first member and the third member.

8 Claims, 12 Drawing Sheets

FIG.2
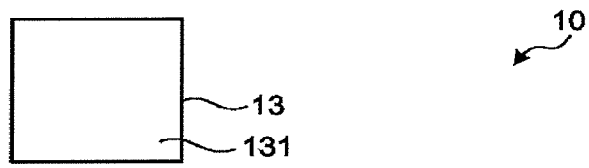
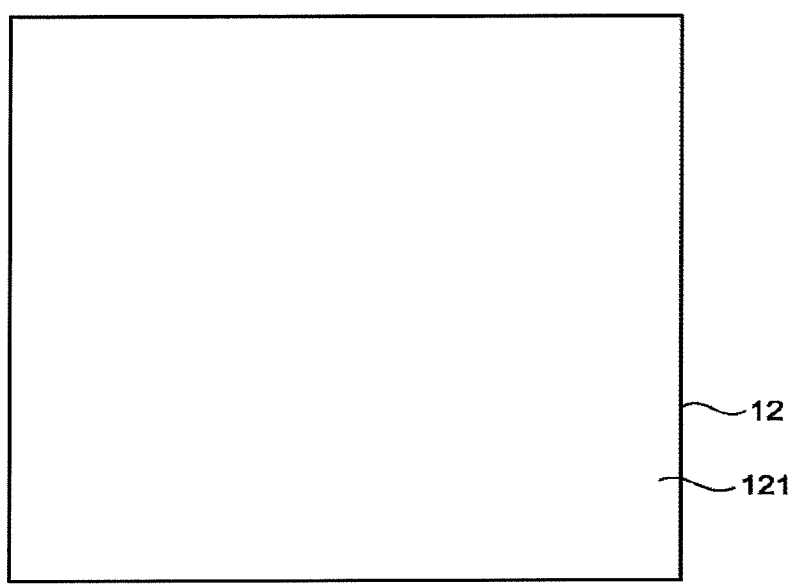
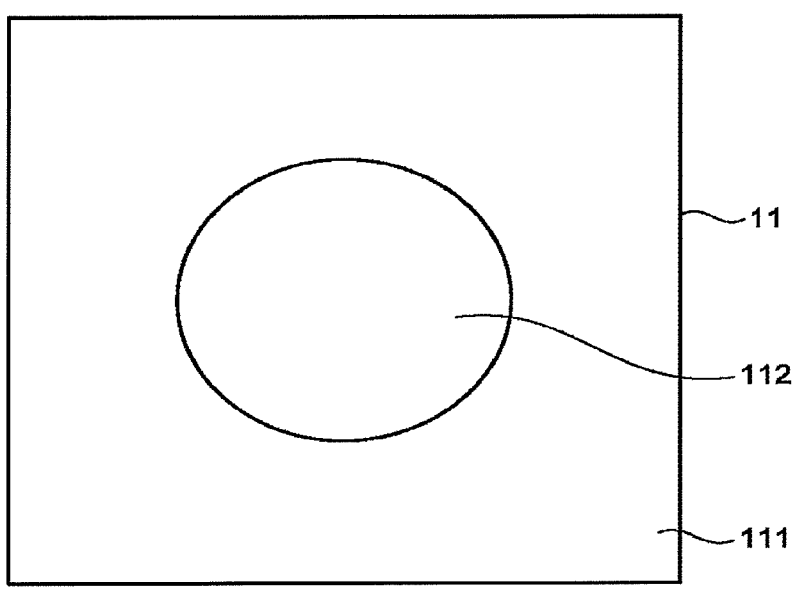

FIG.4
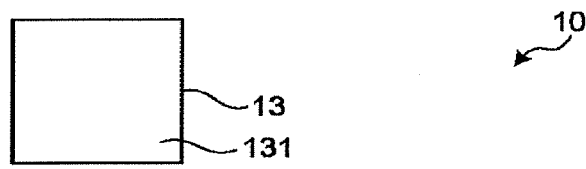
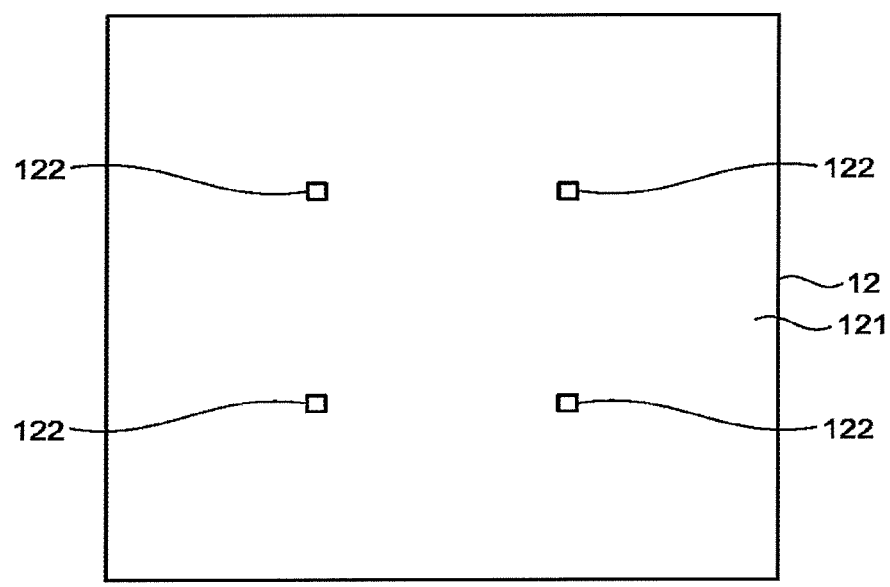
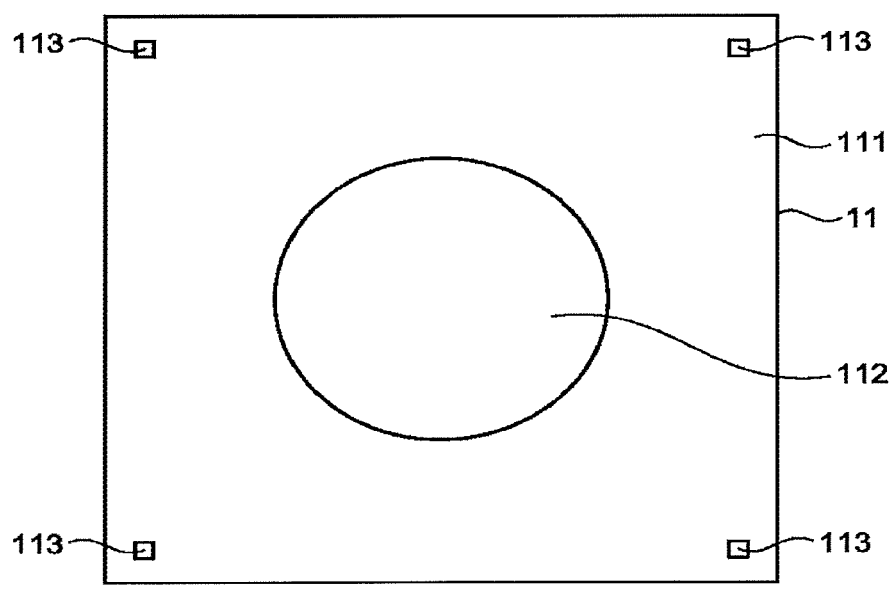

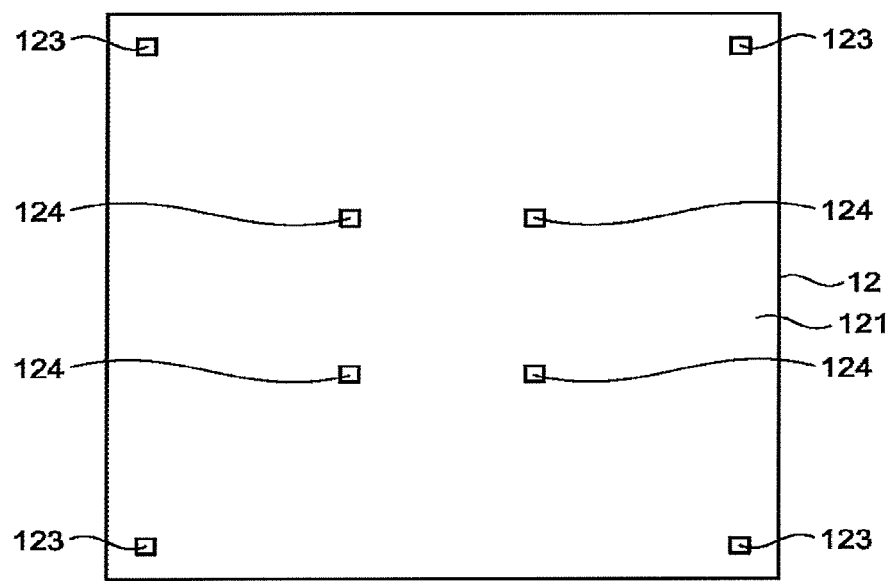
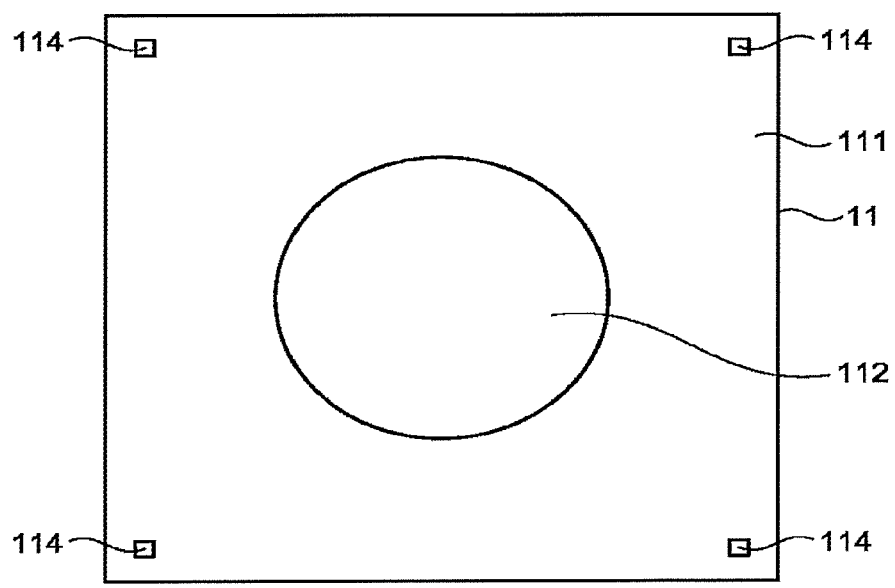
FIG.6

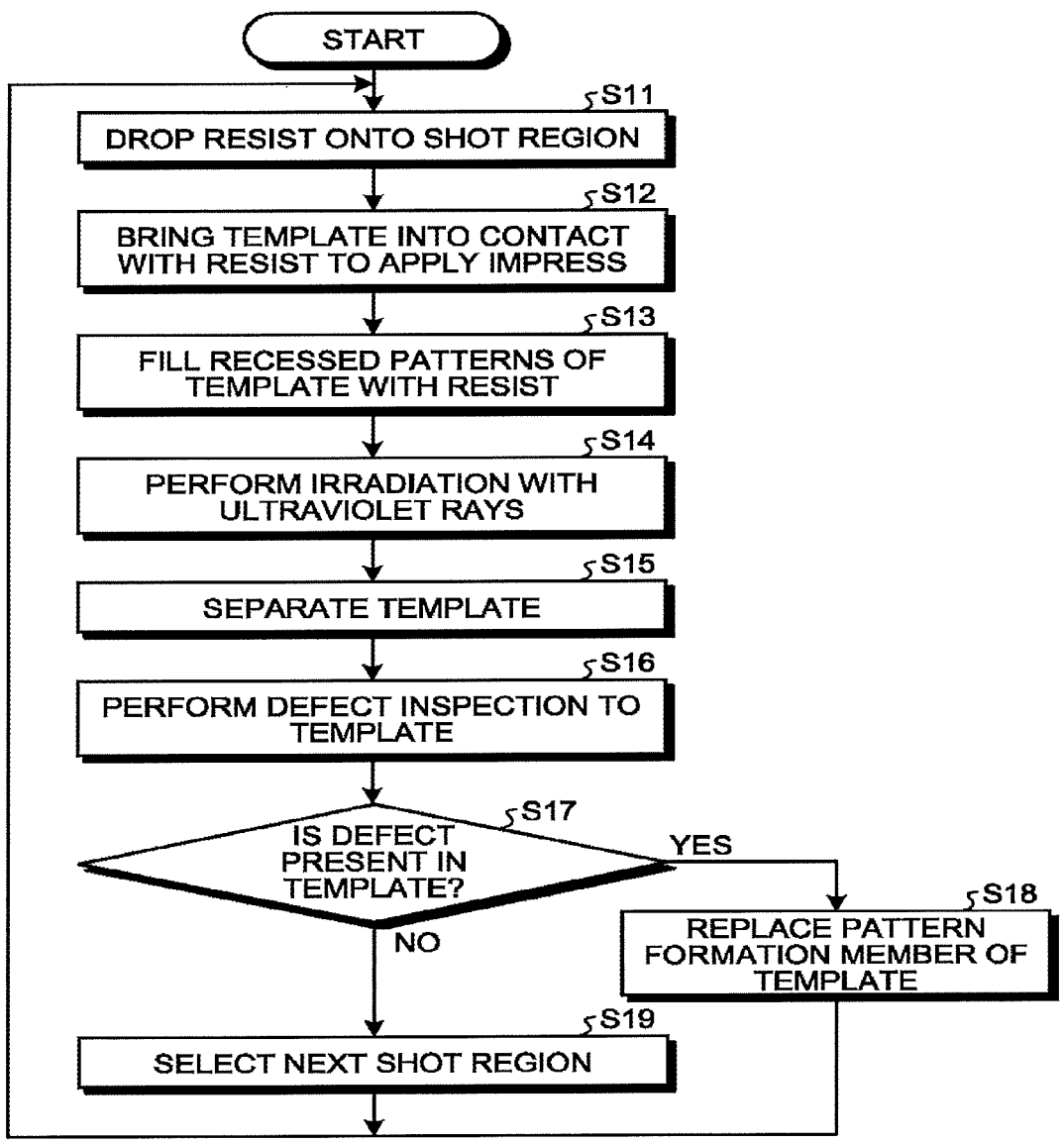

TEMPLATE, TEMPLATE COMPONENT, AND SEMICONDUCTOR DEVICE MANUFACTURING METHOD

CROSS-REFERENCE TO RELATED APPLICATIONS

This application is based upon and claims the benefit of priority front Japanese Patent Application No. 2017-170372, filed on Sep. 5, 2017; the entire contents of which are incorporated herein by reference.

FIELD

Embodiments described herein relate generally to a template, a template component, and a semiconductor device manufacturing method.

BACKGROUND

A template used in an imprint method is prepared from a flat plate-shaped template substrate made of quartz glass. In the template substrate, a counterbore is formed on one of the main surfaces, and a mesa part is formed on the other of the main surfaces. The mesa part is provided with a concave-convex pattern, which is present within a region where the counterbore is formed. In order to manufacture a template having this structure, a certain cost is required. Further, the template is set in contact with a resist to perform pattern transfer, and thus its pattern arrangement face may be damaged or deteriorated. In this case, a new template needs to be manufactured, and a certain cost is required.

However, conventionally, a technique has not been proposed to lower the template manufacturing cost.

BRIEF DESCRIPTION OF THE DRAWINGS

FIG. 2 is a top view illustrating the template according to the first embodiment in a state exploded into respective components;

FIG. 4 is a top view illustrating a configuration example of respective members of a template in a case where alignment marks are provided only on either one of two members to be mutually laminated, according to the first embodiment;

FIG. 6 is a top view illustrating a configuration example of respective members of a template in a case where alignment marks are provided on two members to be mutually laminated, according to the first embodiment;

FIG. 7 is a flowchart illustrating an example of the sequence of a semiconductor device manufacturing method using a template according to the first embodiment;

DETAILED DESCRIPTION

In general, according to one embodiment, a template includes a flat plate-shaped first member, a flat plate-shaped second member including a pattern arrangement face, and a flat plate-shaped third member provided with an opening at a position corresponding to an arrangement position of the second member. The template is dividable at a position of at least one of a first boundary between the first member and the second member and a second boundary between the first member and the third member.

Exemplary embodiments of a template, a template component, and a semiconductor device manufacturing method will be explained below in detail with reference to the accompanying drawings. The present invention is not limited to the following embodiments. The sectional views of a template used in the following embodiments are schematic, and so the relationship between the thickness and width of each member and/or the thickness ratios between respective members may be different from actual states.

First Embodiment

Figure 1A:
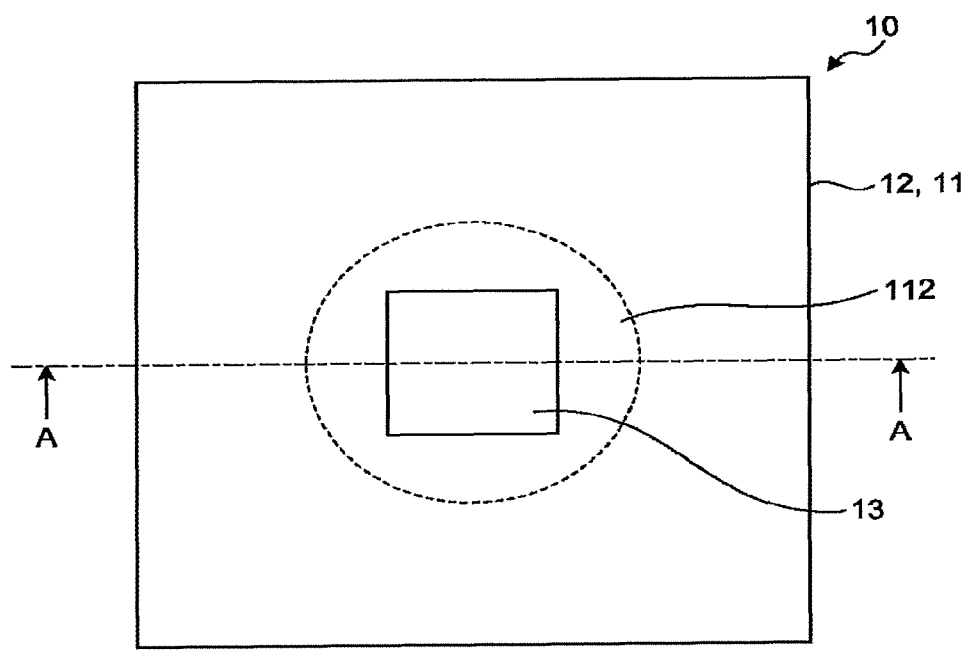
FIGS. 1A and 1B are diagrams schematically illustrating a configuration example of a template according to a first embodiment.
Figure 1B:
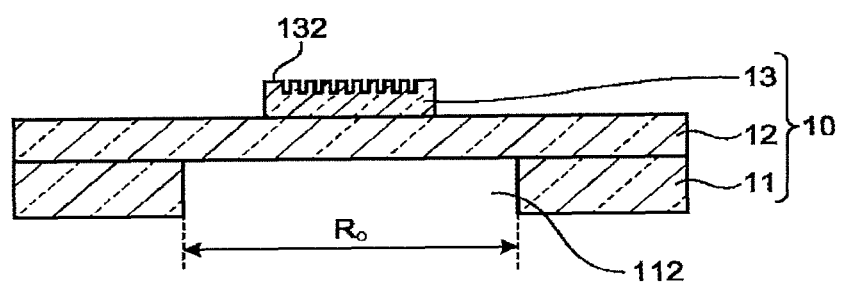
Figure 3:
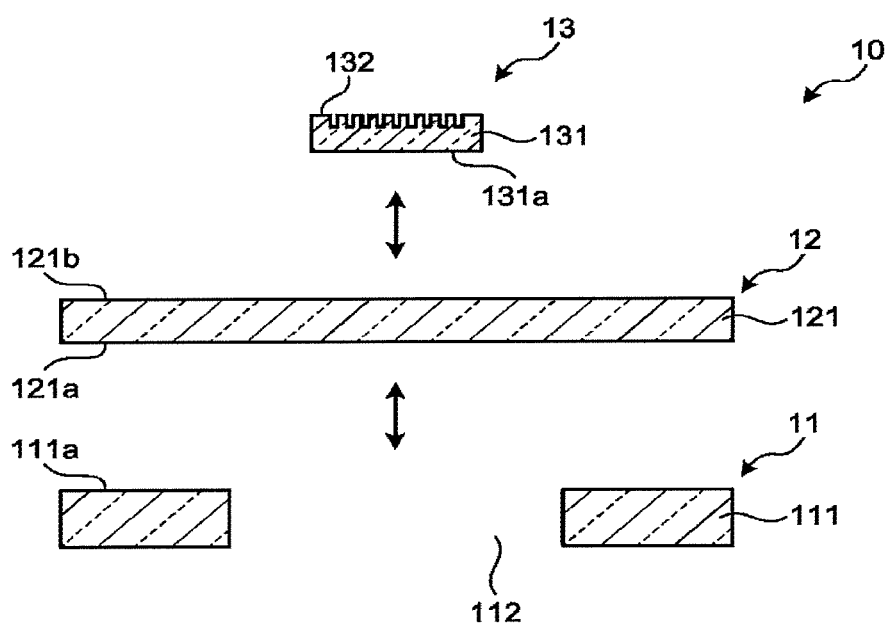
FIG. 3 is a sectional view illustrating the template according to the first embodiment in a state exploded into respective components.

FIGS. 1A and 1B are diagrams schematically illustrating a configuration example of a template according to a first embodiment. FIG. 1A is a top view, and FIG. 1B is a sectional view taken along a line A-A of FIG. 1A. FIG. 2 is a top view illustrating the template according to the first embodiment in a state exploded into respective components. FIG. 3 is a sectional view illustrating the template according to the first embodiment in a state exploded into respective components.

In an ordinary template, a counterbore is formed on one surface of a template substrate, and a pattern arrangement face including a concave-convex pattern is provided on the surface opposite to the surface formed with the counterbore. The pattern arrangement face is arranged to be present within a region where the counterbore is formed. The pattern arrangement face has a mesa structure projected from around this face. In the first embodiment, as illustrated in FIGS. 1A to 3, the template 10 has a configuration including three components, which are a pedestal member 11 as a first member, a support member 12 as a second member, and a pattern formation member 13 as a third member. The pedestal member 11 and the support member 12 are laminated to each other, and the support member 12 and the pattern formation member 13 are laminated to each other. For example, each of the pedestal member 11, the support member 12, and the pattern formation member 13 is formed by using quartz glass or the like as a material.

The pedestal member 11 is formed of a rectangular flat plate 111, and includes an opening 112 penetrating the flat plate 111 in the thickness direction at and near the center.

The opening 112 is a part to be a counterbore when the template 10 has been assembled.

The support member 12 is formed of a rectangular flat plate 121. In this example, when seen in a plan view, the support member 12 has an outer shape and a size the same as those of the pedestal member 11. However, the support member 12 may have an outer shape the same as that of the pedestal member 11 and have a size smaller than that of the pedestal member 11.

The pattern formation member 13 is formed of a rectangular flat plate 131, and includes a pattern arrangement face 132 on one of the main surfaces. The pattern arrangement face 132 is provided with a concave-convex pattern composed of recessed and projected portions reverse to those of the pattern to be formed on a processing object, for example. Here, the pattern arrangement face 132 is provided with a pattern for forming devices and wiring lines to be transferred to the processing object, and alignment marks to be used for positioning between the template 10 and the processing object in an imprint process. Further, the pattern formation member 13 is arranged to be present within a region R where the opening 112 is formed in the pedestal member 11.

The upper surface 111a of the pedestal member 11 and the lower surface 121a of the support member 12 are mutually laminated, and the upper surface 121b of the support member 12 and the lower surface 131a of the pattern formation member 13 are mutually laminated. For example, the laminating operation is performed as follows: First, each of the upper surface 111a of the pedestal member 11, the lower surface 121a of the support member 12, the upper surface 121b of the support member 12, and the lower surface 131a of the pattern formation member 13 is processed by mirror polishing until the surface roughness RMS (Root Mean Square) becomes 0.005 nm or more and 0.30 nm or less. Then, two surfaces thus processed by the mirror polishing are set in contact with each other. Here, the laminating operation may be performed by adhering two members to each other by using an adhesive, for example.

Here, an explanation will be given of laminating operation for respective members. When members are to be mutually laminated, alignment marks are used. The alignment marks may be provided only on either one of the two members to be mutually laminated, or may be provided on both of the two members to be mutually laminated. It should be noted that these alignment marks are different from alignment marks to be used for positioning with respect to the processing object in an imprint process.

Figure 5:
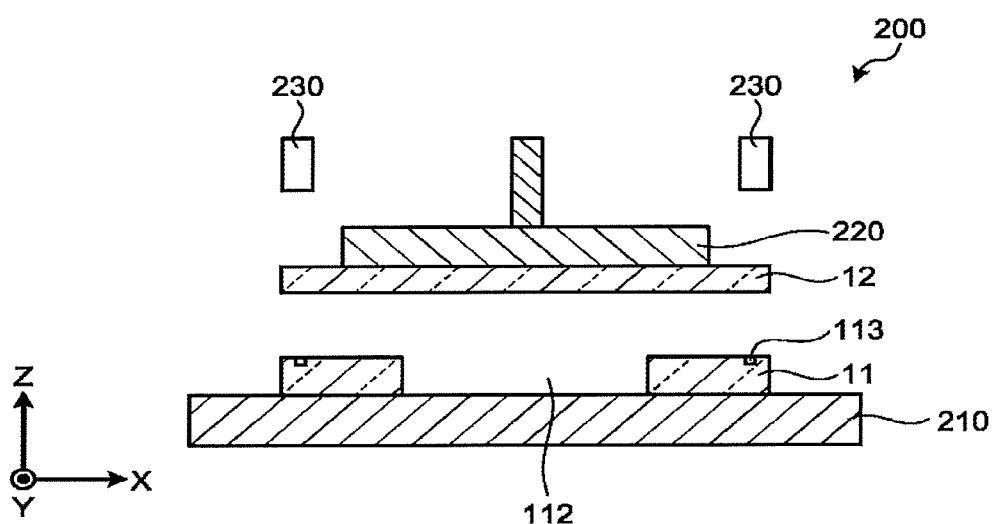
FIG. 5 is a sectional view schematically illustrating an example of laminating two members y using a laminating apparatus according to the first embodiment.

FIG. 4 is a top view illustrating a configuration example of respective members of a template in a case where alignment marks are provided only on either one of two members to be mutually laminated, according to the first embodiment. FIG. 5 is a sectional view schematically illustrating an example of laminating two members by using a laminating apparatus according to the first embodiment.

The laminating apparatus 200 illustrated in FIG. 5 includes a first holder 210 for holding one of the members to be mutually laminated, a second holder 220 for holding the other of the members to be mutually laminated, and monitoring parts 230 for optically monitoring the positions of alignment marks provided on a member held on the first holder 210. Here, two directions orthogonal to each other and parallel with the member holding surface of the first holder 210 will be referred to as "X-direction" and "Y-direction", and the direction perpendicular to the X-direction and the Y-direction will be referred to as "Z-direction".

The first holder 210 is configured to hold a member, which is the pedestal member 11 in the example of FIG. 5, by a vacuum chuck mechanism or electrostatic chuck mechanism. The first holder 210 is movable in the X-direction and the Y-direction. A member to be held on the first holder 210 is provided with alignment marks 113.

The second holder 220 is configured to hold a member, which is the support member 12 in the example of FIG. 5, by a vacuum chuck mechanism or electrostatic chuck mechanism. The second holder 220 arranged to face the first holder 210. The position of the second holder 220 is stationary in the X-direction and the Y-direction. Further, at least one of tree first holder 210 and the second holder 220 is movable in the Z-direction.

The monitoring parts 230 are arranged at positions that enable the monitoring parts 230 to monitor the alignment marks 113 of a member held on the first holder 210. For example, the monitoring parts 230 are arranged at positions corresponding to the positions of the alignment marks 113 provided on a member held on the first holder 210. The monitoring parts 230 may have a configuration to be movable in the X-direction and the Y-direction.

When the laminating apparatus 200 configured as described above is used to perform laminating operation, as illustrated in FIG. 4, a member to be held on the first holder 210 side is provided with alignment marks. For example, as illustrated in FIG. 5, in a case where the pedestal member 11 is to be held on the first holder 210, and the support member 12 is to be held on the second holder 220, the flat plate 111 of the pedestal member 11 is provided with the alignment marks 113. Here, as illustrated in FIG. 4, the alignment marks 113 are arranged near the four corners of the flat plate 111.

Further, in a case where the support member 12 is to be held on the first holder 210, and the pattern formation member 13 is to be held on the second holder 220, the flat plate 121 of the support member 12 is provided with alignment marks 122. Here, as illustrated in FIG. 4, four alignment marks 122 are arranged near the center of the flat plate 121.

An explanation will be given of a method of laminating two members in the laminating apparatus 200 of FIG. 5. For example, the pedestal member 11 is held on the first holder 210 by a holding mechanism, such as a vacuum chuck mechanism. Further, for example, the support member 12 is held on the second holder 220 by a holding mechanism, such as a vacuum chuck mechanism. Then, the position of the first holder 210 in the X-direction and the Y-direction is adjusted so that the monitoring parts 230 can monitor the alignment marks 113 of the pedestal member 11 held on the first holder 210. After the pedestal member 11 is moved to a position where all the monitoring parts 230 can monitor the respective alignment marks 113, at least one of the first holder 210 and the second holder 220 is moved in a direction to be closer to each other in the Z-direction. Then, the pedestal member 11 and the support member 12 are laminated to each other.

Further, when the pattern formation member 13 is to be laminated to the pedestal member 11 and the support member 12 that have been mutually laminated, the laminating operation is performed in a way substantially the same as that described above. However, in this case, positioning is performed by monitoring the alignment marks 122 provided on the support member 12 of FIG. 4.

Here, in the method described with reference to FIG. 5, as alignment marks are provided only on one of members to be mutually laminated, there may be case where a positional deviation between the two members is generated as compared with the ideal position. However, this positional deviation does not matter so much. In an imprint process, positioning is performed by using alignment marks provided on the pattern arrangement face 132 of the pattern formation member 13 and alignment marks provided on the processing object. Thus, the positional deviation between members in the template 10 affects the imprint process very little.

However, positioning between members to be mutually laminated is not limited to the method described with reference to FIGS. 4 and 5. FIG. 6 is a top view illustrating a configuration example of respective members of a template in a case where alignment marks are provided on two members to be mutually laminated, according to the first embodiment. As illustrated in FIG. 6, the flat plate 111 of the pedestal member 11 is provided with alignment marks 114 near the four corners, to be used for lamination to the support member 12, and the flat plate 121 of the support member 12 is provided with alignment marks 123 near four corners, to be used for lamination to the pedestal member 11. Specifically, the alignment marks 114 of the pedestal member 11 and the alignment marks 123 of the support member 12 are arranged to correspond to each other. Further, the flat plate 131 of the pattern formation member 13 is provided with alignment marks 133 near the four corners, to be used for lamination to the support member 12, and the flat plate 121 of the support member 12 is provided with alignment marks 124 near the center, to be used for lamination to the pattern formation member 13. Specifically, the alignment marks 133 of the pattern formation member 13 and the alignment marks 124 of the support member 12 are arranged to correspond to each other.

Each of the alignment marks 114, 123, 124, and 133 is composed of a diffraction grating pattern, for example. The diffraction grating period of the alignment marks 114 is set slightly different from the diffraction grating period of the alignment marks 123. The diffraction grating period of the alignment marks 124 is set slightly different from the diffraction grating period of the alignment marks 133. In this way, where the periods of corresponding two of the alignment marks 114, 123, 124, and 133 are set slightly different, moire fringes are generated by irradiation with light, and the moire fringes can be used to precisely perform positioning between two members. Here, the principle of positioning of this type is substantially the same as that of positioning between a processing object and a template, which is used in a conventional imprint process and is well known, and so its detailed description will be omitted.

Next, an explanation will be given of a semiconductor device manufacturing method using the template configured as described above. FIG. 7 is a flowchart illustrating an example of the sequence of a semiconductor device manufacturing method using a template according to the first embodiment. FIGS. 8A to 8E are sectional views schematically illustrating an example of procedures for the semiconductor device manufacturing method using a template according to the first embodiment. Here, an imprint process is performed in a He gas atmosphere.

Figure 8A:
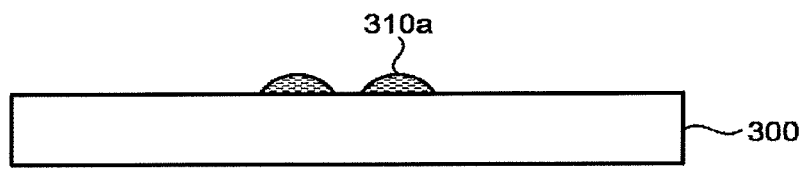
FIGS. 8A to 8E are sectional views schematically illustrating an example of procedures for the semiconductor device manufacturing method using a template according to the first embodiment.
Figure 8B:
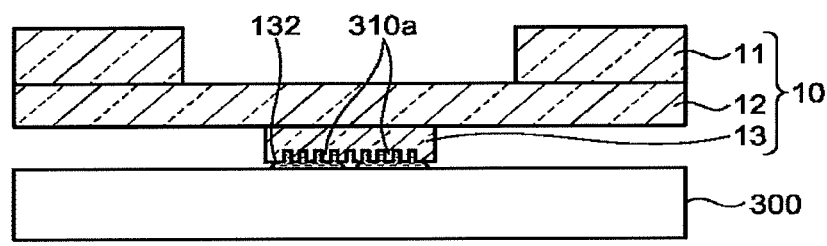
Figure 8C:
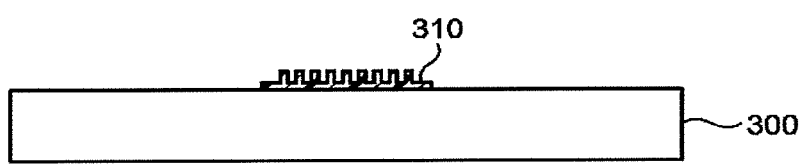

First, a resist 310a is dropped onto shot region on a processing object 300 (step S11, FIG. 8A). The resist 310a is dropped onto the shot region in accordance with a drop recipe. Further, the resist 310a is dropped by an inkjet method, for example. The processing object 300 is a semiconductor substrate, or a semiconductor film, conductive film, or insulating film formed on a semiconductor substrate, for example.

Then, the pattern arrangement face 132 of the template 10 according to the first embodiment is brought into contact with the resist 310a to apply an impress (step 312). Further, while positioning between the template 10 and the processing object 300 is performed by using the alignment marks, and the recessed patterns provided on the pattern arrangement face 132 of the template 10 are filled with the resist 310a (step S13, FIG. 8B).

After a lapse of a predetermined time, for example, a time sufficient to fill the recessed patterns with the resist 310a, the resist 310a is irradiated with ultraviolet rays through the template 10 (step S14). Consequently, the resist 310a is cured into a resist pattern 310. Then, the template 10 is separated from the resist pattern 310 (step S15, FIG. 8C).

Then, a defect inspection is performed to the concave-convex pattern provided on the pattern arrangement face 132 of the template 10 (step S16). For example, the defect inspection to the template 10 is performed by using a short-wavelength laser (such as a solid Second-Harmonic Generation (SHG) laser having a wavelength of 193 nm).

Figure 8D:
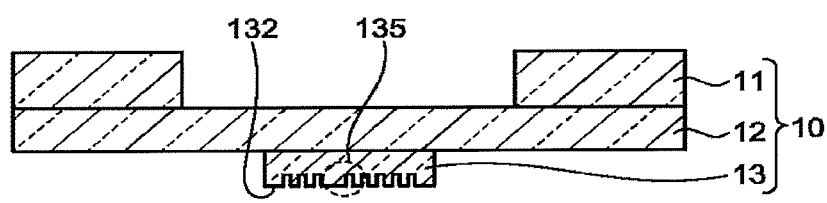
Figure 8E:
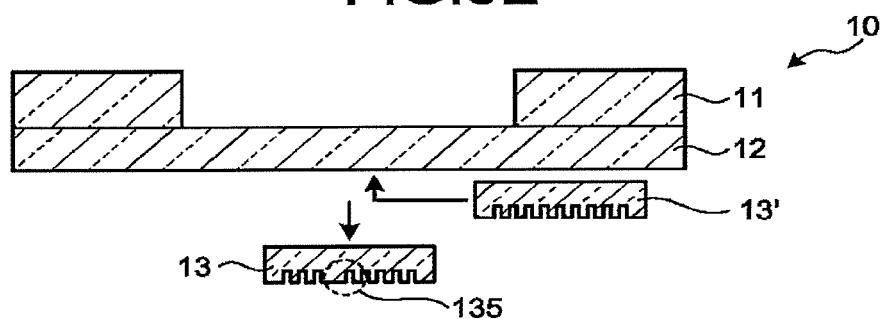

On the basis of a result of the defect inspection to the template 10, it is determined whether a defect is present in the template 10 (step S17). For example, as illustrated in FIG. 8D, when a defect 135 is present in the template 10 (Yes at step S17), the pattern formation member 13 of the template 10 is replaced (step S18). As illustrated in FIG. 8E, in the template 10, the pattern formation member 13 with the defect 135 generated therein is peeled off the support member 12, and a new pattern formation member 13' having no defect 135 is laminated to the support member 12. In a case where the pattern formation member 13 and the support member 12 are mutually laminated by setting mirror polishing surfaces in contact with each other, the pattern formation member 13 is peeled off the support member 12 by placing the template 10 in a vacuum atmosphere, for example. On the other hand, in a case where the pattern formation member 13 and the support member 12 are mutually laminated by using an adhesive, the pattern formation member 13 can be peeled off the support member 12 by stripping away the adhesive.

After step S18, or when no defect 135 is present in the template 10 in step S17 (No at step S17), the next shot region on the processing object 300 is selected (step S19), and the process sequence goes back to step S11. The processes described above are repeatedly performed.

After the imprint process is finished to all the shot regions, the resist pattern formed by the imprint process is used as a mask to perform an etching process, such as a Reactive Ion Etching (RTE) method, and thereby to work the processing object 300 into a desired shape. The processes described above are repeated to manufacture semiconductor devices.

In the above description, a configuration is illustrated in which the template 10 is dividable into three members, i.e., the pedestal member 11, the support member 12, and the pattern formation member 13, and in which the pedestal member 11 and the support member 12 are mutually laminated, and the support member 12 and the pattern formation member 13 are mutually laminated. However, the embodiment is not limited to this. For example, in the template 10 including the pedestal member 11, the support member 12, and the pattern formation member 13, it is sufficient if the template 10 is dividable at a position of at least one of the portions between the pedestal member 11 and the support member 12 and between the support member 12 and the pattern formation member 13, and the two members mutually detachable are laminated to each other.

Figure 9A:
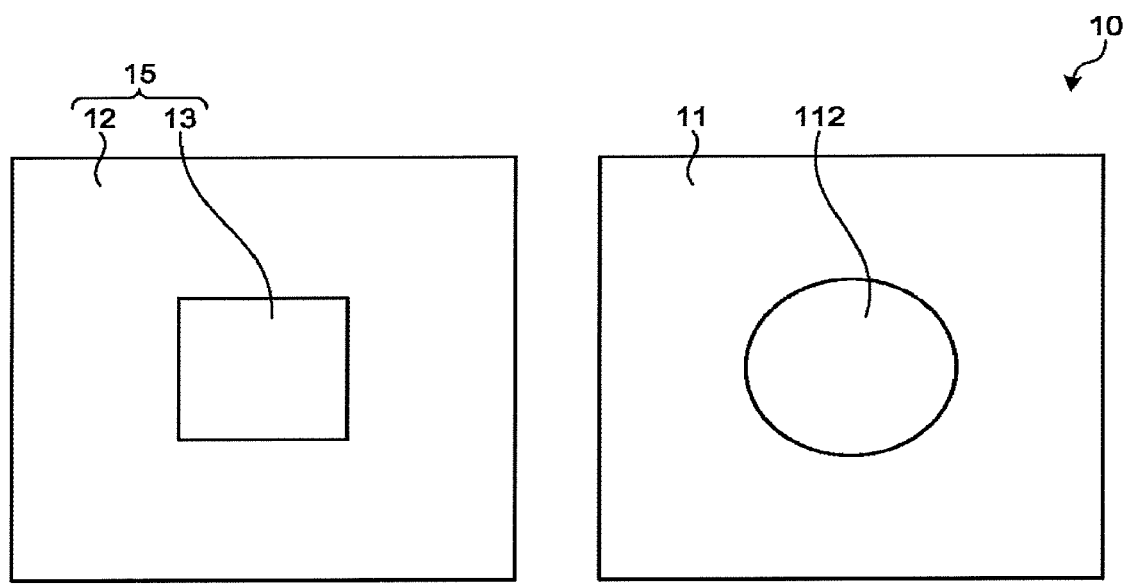
FIGS. 9A and 9B are diagrams illustrating another configuration example of a template according to the first embodiment.
Figure 9B:
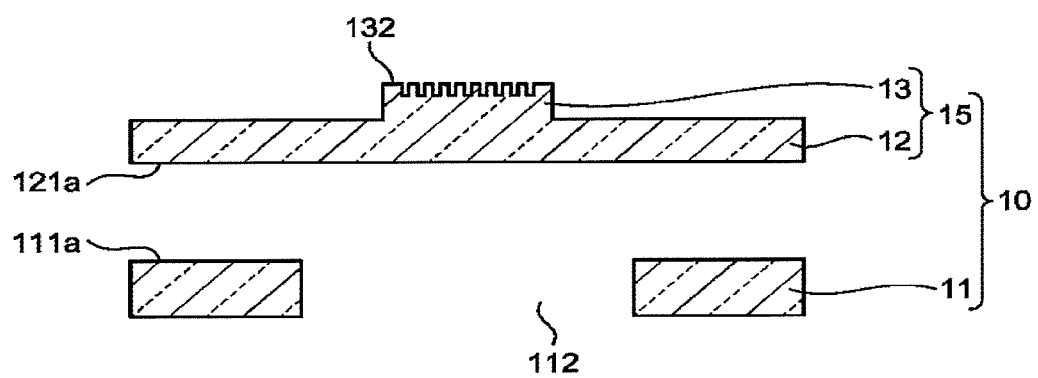
Figure 10A:
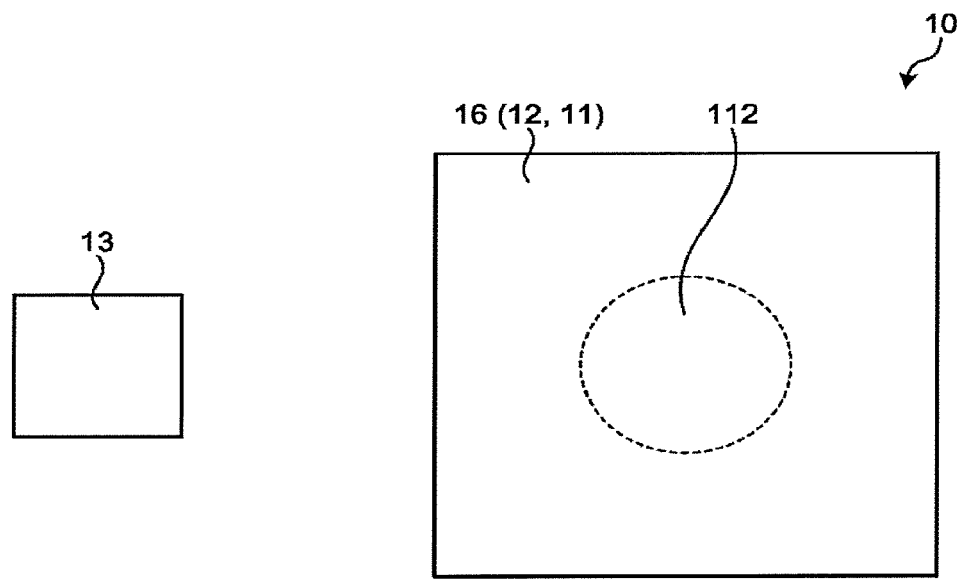
FIGS. 10A and 10B are diagrams illustrating another configuration example of a template according to the first embodiment.
Figure 10B:
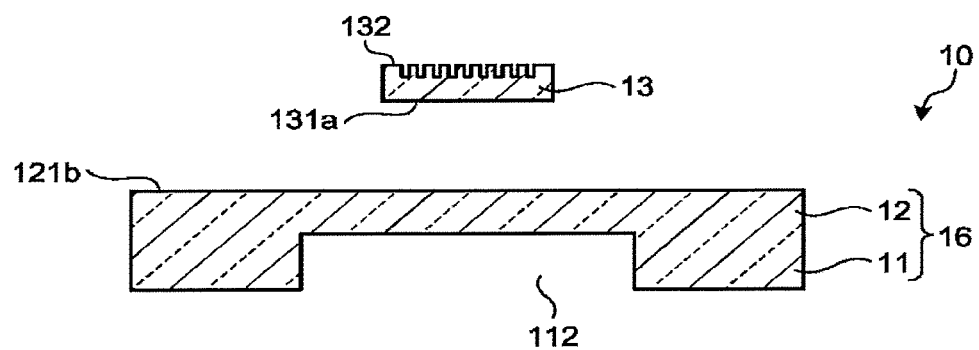

FIGS. 9A and 9B and FIGS. 10A and 10B are diagrams illustrating other configuration examples of a template according to the first embodiment. Each of FIGS. 9A and 10A is a top view illustrating an example of template components. Each of FIGS. 9B and 10B is a sectional view illustrating the example of template components. FIGS. 9A and 9B illustrate a case where the template 10 is composed of two members, which are a pedestal member 11 and a pattern support member 15, and these two members are laminated to each other. The pattern support member 15 is prepared by integrally forming the support member 12 and the pattern formation member 13. Here, the upper surface 111a of the pedestal member 11 and the lower surface 121a of the pattern support member 15 are mutually laminated.

In the template 10 configured as described above, when a defect is generated in the pattern arrangement face 132 of the pattern support member 15, the pattern support member 15 is peeled off the pedestal member 11, and is replaced with a pattern support member 15 including a pattern arrangement face 132 having no defect.

FIGS. 10A and 10B illustrate a case where the template 10 is composed of two members, which are a pedestal support member 16 and a pattern formation member 13, and these two members are laminated to each other. The pedestal support member 16 is prepared by integrally forming the pedestal member 11 and the support member 12. Here, the upper surface 121b of the pedestal support member 16 and the lower surface 131a of the pattern formation member 13 are mutually laminated.

In the template 10 configured as described above, when a defect is generated in the pattern arrangement face 132 of the pattern formation member 13, the pattern formation member 13 is peeled off the pedestal support member 16, and is replaced with a pattern formation member 13 including a pattern arrangement face 132 having no defect.

Figure 11A:
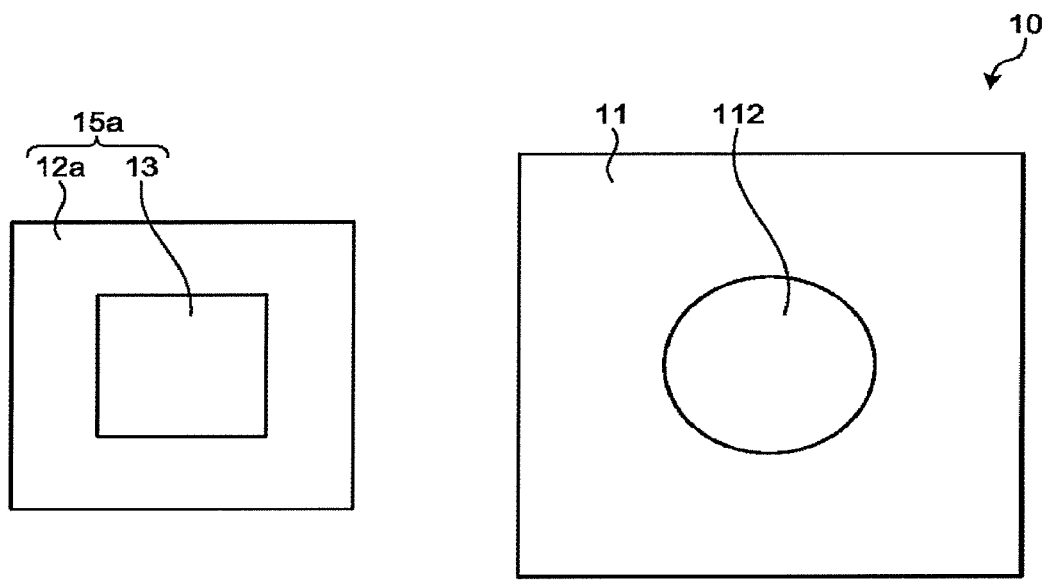
FIGS. 11A and 11B are diagrams illustrating another configuration example of a template according to the first embodiment.
Figure 11B:
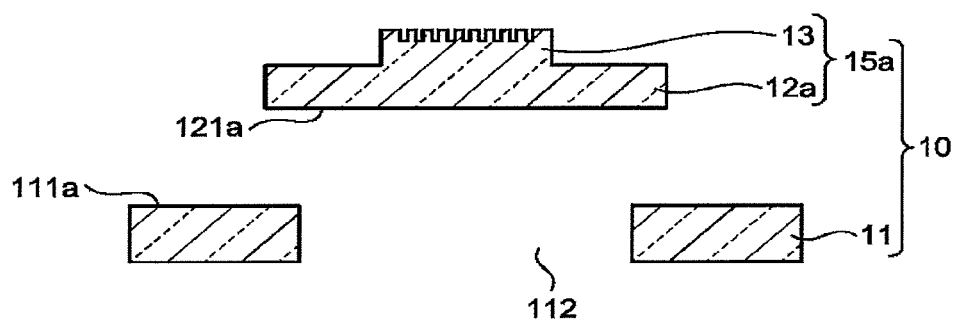

Further, in the above description, a case has been explained where the size of the support member 12 in a direction parallel with the pattern arrangement face 132 is the same as that of the pedestal member 11. However, the embodiment is not limited to this. FIGS. 11A and 11B are diagrams illustrating another configuration example of a template according to the first embodiment. FIG. 11A is a top view illustrating an example of template components. FIG. 11B is a sectional view illustrating the example of template components. FIGS. 11A and 11B illustrates a case where the template 10 is composed of two members, which are a pedestal member 11 and a pattern support member 15a, and these two members are laminated to each other. The pattern support member 15a is prepared by integrally forming a support member 12a and the pattern formation member 13. However, the size of the pattern support member 15a (support member 12a) in a direction parallel with the pattern arrangement face 132 is set smaller than the pedestal member 11 and larger than the opening 112 formed in the pedestal member 11. Here, the upper surface 111a of the pedestal member 11 and the lower surface 121a of the pattern support member 15a are mutually laminated.

Conventionally, a single template substrate is subjected to machine working to form a counterbore on one of the surfaces, and is further subjected to wet processing to form a structure on the other of the surfaces. Consequently, the process cost is increased. Further, when the template is damaged, the template needs to be replaced.

On the other hand, in the first embodiment, the template 10 includes three components, which are the pedestal member 11, the support member 12, and the pattern formation member 13. The template 10 is dividable at a position of at least one of the boundary between the pedestal member 11 and the support member 12 and the boundary between the support member 12 and the pattern formation member 13. Further, the two members mutually detachable are laminated to each other to assemble the template 10. Consequently, when the template 10 is damaged, the damaged one of the pedestal member 11, the support member 12, and the pattern formation member 13 needs to be replaced, but the other members can be kept used without replacement. Thus, it is possible to reduce the manufacturing cost of the template. Further, the template 10 is made of inexpensive glass containing no additive, and thereby it is also possible to reduce the cost of the template.

Second Embodiment

In the first embodiment, the template is formed by using quartz glass, whose main components are silicon and oxygen, as a material. In the second embodiment, an explanation will be given of a case where some, of the members constituting a template are made of a two-component glass.

Figure 12A:
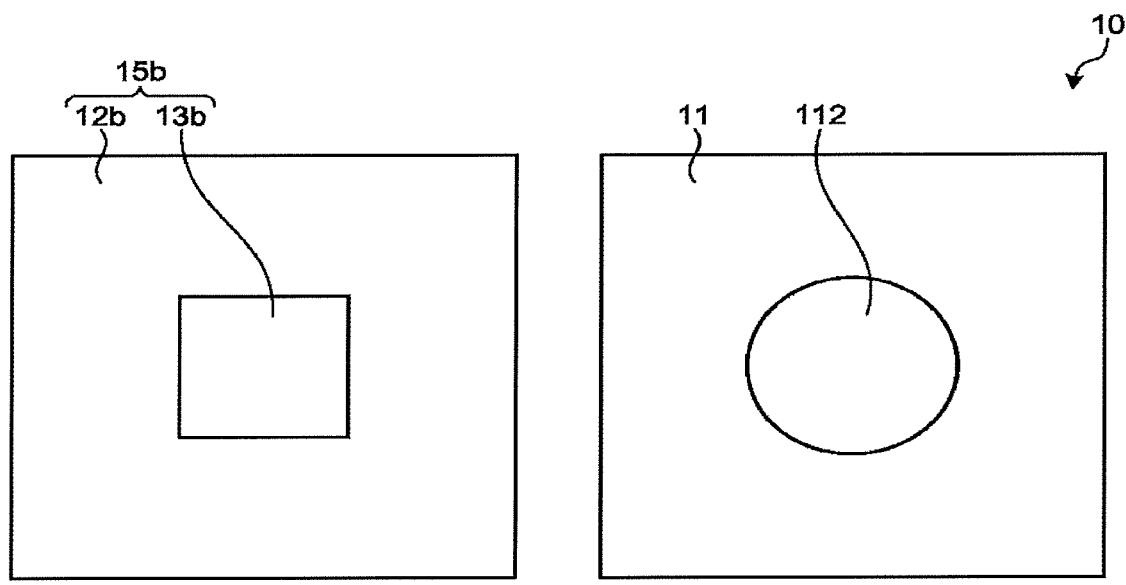
FIGS. 12A and 12B are diagrams illustrating a configuration example of a template according to a second embodiment.
Figure 12B:
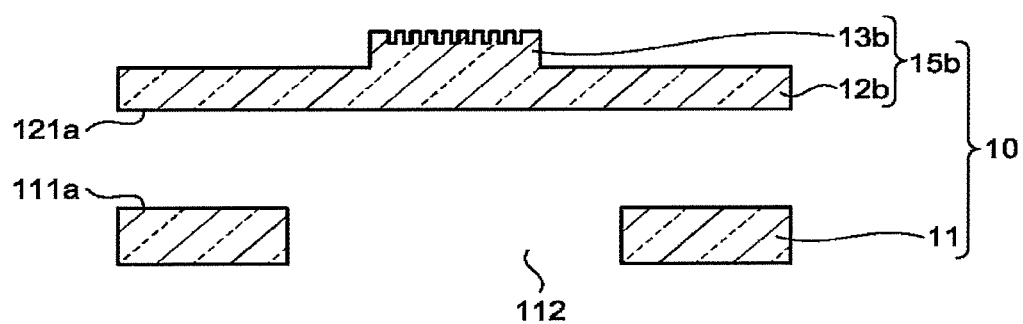

FIGS. 12A and 12B are diagrams illustrating a configuration example of a template according to a second embodiment. FIG. 12A is a top view illustrating an example of template components. FIG. 12B is a sectional view illustrating the example of template components. FIGS. 12A and 128 illustrate a case where the template 10 is composed of two members, which are a pedestal member 11 and a pattern support member 15b, and these two members are laminated to each other. The pattern support member 15b is prepared by integrally forming a support member 12b and a pattern formation member 13b, which are made of a two-component glass. Here, the upper surface 111a of the pedestal member 11 and the lower surface 121a of the pattern support member 15b are mutually laminated. The two-component glass is glass in which oxide of a metal selected from the group consisting of Ti, Al, and Nb is added to quartz glass. For example, a two-component glass containing 92 wt % of $SiO_2$ and 8 wt % of $TiO_2$ may be used.

An imprint process is performed in a He gas atmosphere, as described above. In the imprint process, the template 10 is set in contact with the resist 310a, and the recessed patterns of the template 10 are filled with the resist 310a. However, in the initial state, the recessed patterns are filled with He gas. Where the template 10 made of quartz glass is used as in the first embodiment, the He gas inside the recessed patterns is released from the ends of the mesa part along the recessed patterns into the process atmosphere. On the other hand, also where the template 10 including the pattern support member 15b made of a two-component glass is used as in the second embodiment, the He gas is released into the process atmosphere in a way substantially the same as that of the template 10 made of quartz glass. However, in this case, part of the He gas inside the recessed patterns is diffused into the pattern support member 15b made of a two-component glass, and is released into the process atmosphere from the opening 112.

As described above, in the second embodiment, where at least the pattern formation member 13b and the support member 12b are made of a two-component glass, during the imprint process, the He gas can be released into the process atmosphere through the pattern formation member 13b and the support member 12b. Accordingly, also in each of the examples described in the first embodiment, a member corresponding to the support member 12 and the pattern formation member 13 may be made of a two-component glass. For example, in the case of the template 10 of FIGS. 1A and 1B, the support member 12 and the pattern formation member 13 may be made of a two-component glass. Further, in the case of the template 10 of FIGS. 10A and 10B, the pattern formation member 13 and the pedestal support member 16 may be made of a two-component glass. Further, in the case of the template 10 of FIGS. 11A and 11B, the pattern support member 15a may be made of a two-component glass.

In the second embodiment, at least the pattern formation member 13 and the support member 12 of the template 10 are made of a two-component glass. Consequently, during the imprint process, He gas filling the recessed patterns is released into the process atmosphere through the pattern formation member 13 and the support member 12. Thus, it is possible to suppress remaining of gas bubbles in the resist pattern 310, in addition to the effect of the first embodiment. Here, in the above description, at least the pattern formation member 13 and the support member 12 of the template 10 may made of a multi-component glass, such as a three-component glass, instead of a two-component glass as described above. The multi-component glass is glass in which oxide of one or more metals selected from the group consisting of Ti, Al, and Nb is added to quartz glass.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for providing a template, the method comprising:
    forming a flat plate-shaped pedestal member with a circular opening, a flat plate-shaped support member, and a flat plate-shaped pattern formation member including a pattern arrangement face;
    disposing the pattern arrangement face at a position corresponding to the circular opening of the flat plate-shaped pedestal member;
    setting mirror polishing surfaces in contact with each other to laminate the flat plate-shaped pedestal member and the flat plate-shaped support member so that the surfaces of the flat plate-shaped pedestal member and the flat plate-shaped support member facing a boundary have a surface roughness Root Mean Square (RMS) falling within a range of 0.005 nm to 0.30; and
    setting mirror polishing surfaces in contact with each other to laminate the flat plate-shaped support member and the flat plate-shaped pattern formation member.

2. The method according to claim 1, wherein the flat plate-shaped support member and the flat plate-shaped pattern formation member are laminated by setting mirror polishing surface in contact with each other such that the surfaces of the flat plate-shaped support member and the flat plate-shaped pattern formation members facing a boundary have a surface roughness Root Mean Square (RMS) falling within a range of 0.005 nm to 0.30 nm.

3. The method according to claim 1, further comprising:
    providing the flat plate-shaped support member and the flat plate-shaped pattern formation member with a first alignment mark used for positioning between the flat plate-shaped support member and the flat plate-shaped pattern formation member, and
    providing the flat plate-shaped support member and the flat plate-shaped pedestal member with a second alignment mark used for positioning between the flat plate-shaped support member and the flat plate-shaped pedestal member.

4. The method according to claim 3, further comprising:
    forming the flat plate-shaped pedestal member to make a first size of the flat plate-shaped pedestal member in a direction parallel with the pattern arrangement face smaller than a second size of the flat plate-shaped support member and larger than a third size of the opening.

5. The method according to claim 1, further comprising:
    forming the flat plate-shaped pedestal member to have an outer shape same as that of the flat plate-shaped support member and make a first size of the flat plate-shaped pedestal member in a direction parallel with the pattern arrangement face same as a second size of the flat plate-shaped support member.

6. The method according to claim 1, wherein the flat plate-shaped pedestal member, the flat plate-shaped support member, and the flat plate-shaped pattern formation member are made of quartz glass.

7. The method according to claim 1, wherein the flat plate-shaped support member and the flat plate-shaped pattern formation member are made of a multi-component glass.

8. The method according to claim 7, wherein the multi-component glass is glass in which oxide of one or more metals selected from a group including Ti, Al, and Nb is added to quartz glass.

* * * * *